United States Patent [19]
Udomoto et al.

[11] Patent Number: 6,020,613
[45] Date of Patent: Feb. 1, 2000

[54] FIELD EFFECT TRANSISTOR ARRAY INCLUDING RESISTIVE INTERCONNECTIONS

[75] Inventors: Junichi Udomoto; Makio Komaru, both of Tokyo, Japan

[73] Assignee: Mitsubishi Denki Kabushiki Kaisha, Tokyo, Japan

[21] Appl. No.: 09/048,891

[22] Filed: Mar. 27, 1998

[30] Foreign Application Priority Data

Sep. 29, 1997 [JP] Japan ................................ 9-263360

[51] Int. Cl.$^7$ .................................................. H01L 29/78
[52] U.S. Cl. .......................... 257/341; 257/365; 257/536
[58] Field of Search ................................ 257/341, 342, 257/365, 270, 536, 275

[56] References Cited

U.S. PATENT DOCUMENTS

| | | | |
|---|---|---|---|
| 4,034,399 | 7/1977 | Brukier et al. | 257/275 |
| 4,430,623 | 2/1984 | Bert et al. | 257/275 |
| 4,771,195 | 9/1988 | Stein | 257/365 |
| 4,939,485 | 7/1990 | Eisenberg | 257/277 |
| 5,345,194 | 9/1994 | Nagasako | 257/365 |
| 5,563,439 | 10/1996 | Chung et al. | 257/365 |
| 5,652,452 | 7/1997 | Asano | 257/341 |
| 5,677,555 | 10/1997 | Kalpakjian et al. | 257/401 |
| 5,786,627 | 7/1998 | Inoue et al. | 257/679 |
| 5,883,407 | 3/1999 | Kunii et al. | 257/275 |

FOREIGN PATENT DOCUMENTS

| | | |
|---|---|---|
| 116656 | 6/1989 | Japan . |
| 2110943 | 4/1990 | Japan . |
| 411743 | 1/1992 | Japan . |
| 5275465 | 10/1993 | Japan . |
| 774185 | 3/1995 | Japan . |
| 7226488 | 8/1995 | Japan . |

*Primary Examiner*—David B. Hardy
*Attorney, Agent, or Firm*—Leydig, Voit & Mayer, Ltd.

[57] ABSTRACT

A semiconductor device includes a high-power output transistor chip in which transistor cells are connected in parallel, each transistor cell including stripe-shaped gate electrodes connected to a gate bus, stripe-shaped drain electrodes connected to a drain pad, and stripe-shaped source electrodes connected to a source pad, wherein the drain electrodes and the source electrodes are alternatingly arranged and pairs of source and drain electrodes face each other across one of the gate electrodes; and a resistor including a portion of the gate bus between adjacent transistor cells, for preventing oscillation between the adjacent transistor cells. Since the resistor serves as a loss component, oscillation due to an imbalance in characteristics between adjacent transistor cells is cancelled so that the synthesis efficiency of the transistor cells is improved. Furthermore, since the resistor is disposed between adjacent cells, this resistor does not act as a loss unless oscillation occurs due to an imbalance in characteristics between the adjacent cells. Thus, there is no possibility that the resistor might increase gate resistance or parasitic capacitance and, therefore, it is possible to stabilize the operation of the transistor by preventing oscillation, without reducing the gain of the transistor.

10 Claims, 10 Drawing Sheets

FIELD EFFECT TRANSISTOR ARRAY INCLUDING RESISTIVE INTERCONNECTIONS

FIELD OF THE INVENTION

The present invention relates to a semiconductor device including a high-power output transistor chip, used as a high-frequency power synthesis IC. More particularly, the invention relates to a semiconductor device including a comb-shaped transistor in which plural transistor cells are arranged in parallel, each transistor cell comprising plural transistor elements of which source electrodes and drain electrodes are alternatingly arranged facing each other.

BACKGROUND OF THE INVENTION

FIG. 9 shows a conventional power synthetic IC in which a high-power output transistor chip 23 is disposed between an input matching circuit 30 and an output matching circuit 31. The input matching circuit 30 and the output matching circuit 31 are disposed on a substrate 22 having a high dielectric constant, and the substrate 22 is disposed on a ceramic substrate 21. The input matching circuit 30 is connected to an input terminal 34 with four wires 33, and the output matching circuit 31 is connected to an output terminal 35 with four wires 33.

The input matching circuit 30 is divided into two patterns 30a and 30b, and the output matching circuit 31 is divided into two patterns 31a and 31b. The purpose of dividing the matching circuit into plural patterns is, since a large matching circuit may have area-to-area variations in characteristics, to make the characteristics of the circuit uniform in each pattern.

In a high-power output transistor employed as a high-frequency power synthetic IC, usually, a plurality of transistor cells (hereinafter referred to simply as cells) are connected in parallel. In the transistor shown in FIG. 9, twelve cells are connected in parallel, and the half of the twelve cells, i.e., six cells, are connected through wires 32 to the input matching circuit pattern 30a and the output matching circuit pattern 31a while the other half of the cells are connected through wires 32 to the input matching circuit pattern 30b and the output matching circuit pattern 31b.

FIG. 10 shows a comb-shaped transistor in which drain electrodes 1 and source electrodes 2 are alternatingly arranged facing each other, as an example of the high-power output transistor chip 23. The source electrodes 2 are connected through an air bridge 3 to source pads 4 and connected through via-holes 5 to a rear electrode (not shown) on the rear surface of a semi-insulating GaAs substrate 18. In the comb-shaped transistor, a single transistor cell comprises fourteen gate fingers, and a gate pad 7 is provided for the fourteen gate fingers. Each gate finger is fed through a gate bus 8.

By the way, in a high-frequency and high-power output transistor, there is a possibility that the transistor might oscillate and form a resonance circuit when a DC or a high frequency signal is applied thereto, because of cell to cell variations in characteristics and impedances. When the transistor forms such a resonance circuit, the operation of the transistor becomes unstable, i.e., no signal is output or unnecessary signals are amplified, whereby the synthesis efficiency is significantly reduced.

In the transistor shown in FIG. 9, the patterns 30a and 30b of the input matching circuit 30 are connected to each other through a resistor 92, and the patterns 31a and 31b of the output matching circuit 31 are connected to each other through a resistor 93, whereby the resistors 92 and 93 serve as gain loss components to prevent the transistor from oscillating when a DC or a high-frequency signal is applied. In this case, however, oscillation between adjacent cells in the transistor chip cannot be prevented.

Meanwhile, Japanese Published Patent Application No. Hei. 4-11743 proposed a semiconductor device capable of preventing unwanted oscillation inside a transistor. This semiconductor device is shown in FIG. 11. In FIG. 11, a bus bar 110 connecting gate electrodes 101 of six transistor cells, and a drain electrode 102 common to the six transistor cells are respectively divided into two parts so that each part corresponds to three transistor cells, and the separated bus bars 110 are connected to each other through a resistor layer 41 while the separated drain electrodes 102 are connected to each other through a resistor layer 42, which resistor layers are disposed on a semiconductor substrate 104. In FIG. 11, reference numerals 113 and 123 designate gate bonding pads and drain bonding pads, respectively. In this semiconductor device, however, oscillation between adjacent cells is not prevented, especially when a high-frequency signal is applied, because of cell to cell variations in characteristics and impedances.

Furthermore, Japanese Published Patent Application No. Hei. 1-166564 proposed a high-power field effect transistor for stable transistor operation. This transistor is shown in FIG. 12. In FIG. 12, a transistor cell comprises a plurality of transistor elements, and gate electrodes 37 of the transistor elements are connected through a gate leading electrode 38 to a gate bonding pad 39. A resistor 36 is connected between each gate electrode 37 and the gate leading electrode 38. In this transistor, however, since the resistor 36 is connected to the gate electrode 37 in series, it significantly reduces the gain of the transistor element.

SUMMARY OF THE INVENTION

It is an object of the present invention to provide a semiconductor device that prevents oscillation between adjacent transistor cells without reducing the gain of each transistor element in the transistor cell.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the invention, a semiconductor device comprises a semiconductor substrate; a high-power output transistor chip disposed on the semiconductor substrate, in which a plurality of transistor cells are connected in parallel; each transistor cell comprising a plurality of stripe-shaped gate electrodes connected to a gate bus, a plurality of stripe-shaped drain electrodes connected to a drain pad, and a plurality of stripe-shaped source electrodes connected to a source pad, wherein the drain electrodes and the source electrodes are alternatingly arranged facing each other across the gate electrodes; and a resistor comprising a portion of the gate bus between adjacent transistor cells, for preventing oscillation that occurs between the adjacent transistor cells. Since the resistor serves as a gain loss component, unwanted oscillation due to unbalance in characteristics between the adjacent transistor cells is canceled, whereby the synthetic efficiency of the transistor is improved. Furthermore, since the resistor is disposed between the adjacent transistor cells, this resistor does not serve as a gain loss component unless oscillation occurs due to unbalance in characteristics between these cells. So, there is no possibility that the resistor might increase the gate resistance or the parasitic capacitance and, therefore, it is possible to make the operation of the transistor stable by canceling oscillation without reducing the gain of the transistor.

According to a second aspect of the invention, a semiconductor device comprises a semiconductor substrate; a high-power output transistor chip disposed on the semiconductor substrate, in which a plurality of transistor cells are connected in parallel; each transistor cell comprising a plurality of stripe-shaped gate electrodes connected to a gate bus, a plurality of stripe-shaped drain electrodes connected to a drain pad, and a plurality of stripe-shaped source electrodes connected to a source pad, the drain electrodes and the source electrodes being alternatingly arranged facing each other across the gate electrodes; and a resistor connecting the drain pads of adjacent transistor cells, for preventing oscillation that occurs between the adjacent transistor cells. Also in this case, since the resistor serves as a gain loss component, unwanted oscillation due to unbalance in characteristics between the adjacent transistor cells is canceled, whereby the synthetic efficiency of the transistor is improved.

According to a third aspect of the invention, a semiconductor device comprises a semiconductor substrate; a high-power output transistor chip disposed on the semiconductor substrate, in which a plurality of transistor cells are connected in parallel; each transistor cell comprising a plurality of stripe-shaped gate electrodes connected to a gate bus, a plurality of stripe-shaped drain electrodes connected to a drain pad, and a plurality of stripe-shaped source electrodes connected to a source pad, the drain electrodes and the source electrodes being alternatingly arranged facing each other across the gate electrodes; a first resistor comprising a portion of the gate bus between adjacent transistor cells, for preventing oscillation that occurs between the adjacent transistor cells; and a second resistor connecting the drain pads of adjacent transistor cells, for preventing oscillation that occurs between the adjacent transistor cells. In this case, as compared with the above-mentioned semiconductor devices wherein the resistor is disposed on either the gate bus side or the drain pad side, oscillation due to unbalance in characteristics between the adjacent cells is canceled in a shorter time.

According to a fourth aspect of the invention, in the above-mentioned semiconductor device, the resistor comprising a portion of the gate bus between adjacent transistor cells is fabricated using a portion of an active layer disposed on the semiconductor substrate, and the resistor is in ohmic contact with the gate bus. Also in this case, since the resistor serves as a gain loss component, unwanted oscillation due to unbalance in characteristics between the adjacent transistor cells is canceled, whereby the synthetic efficiency of the transistor is improved.

According to a fifth aspect of the invention, the above-mentioned semiconductor device further comprises a matching circuit for connecting the transistor chip with another transistor chip, the matching circuit being divided into plural patterns; and a resistor connecting adjacent patterns with each other, for preventing oscillation that occurs between the adjacent patterns. Therefore, unwanted oscillation due to unbalance in characteristics between adjacent transistor cells is canceled. In addition, since the resistor disposed between the adjacent patterns serves as a gain loss component, relatively low-frequency resonation that occurs between the adjacent patterns is canceled as well.

DETAILED DESCRIPTION OF THE PREFERRED EMBODIMENTS

Embodiment 1

Figure 1:
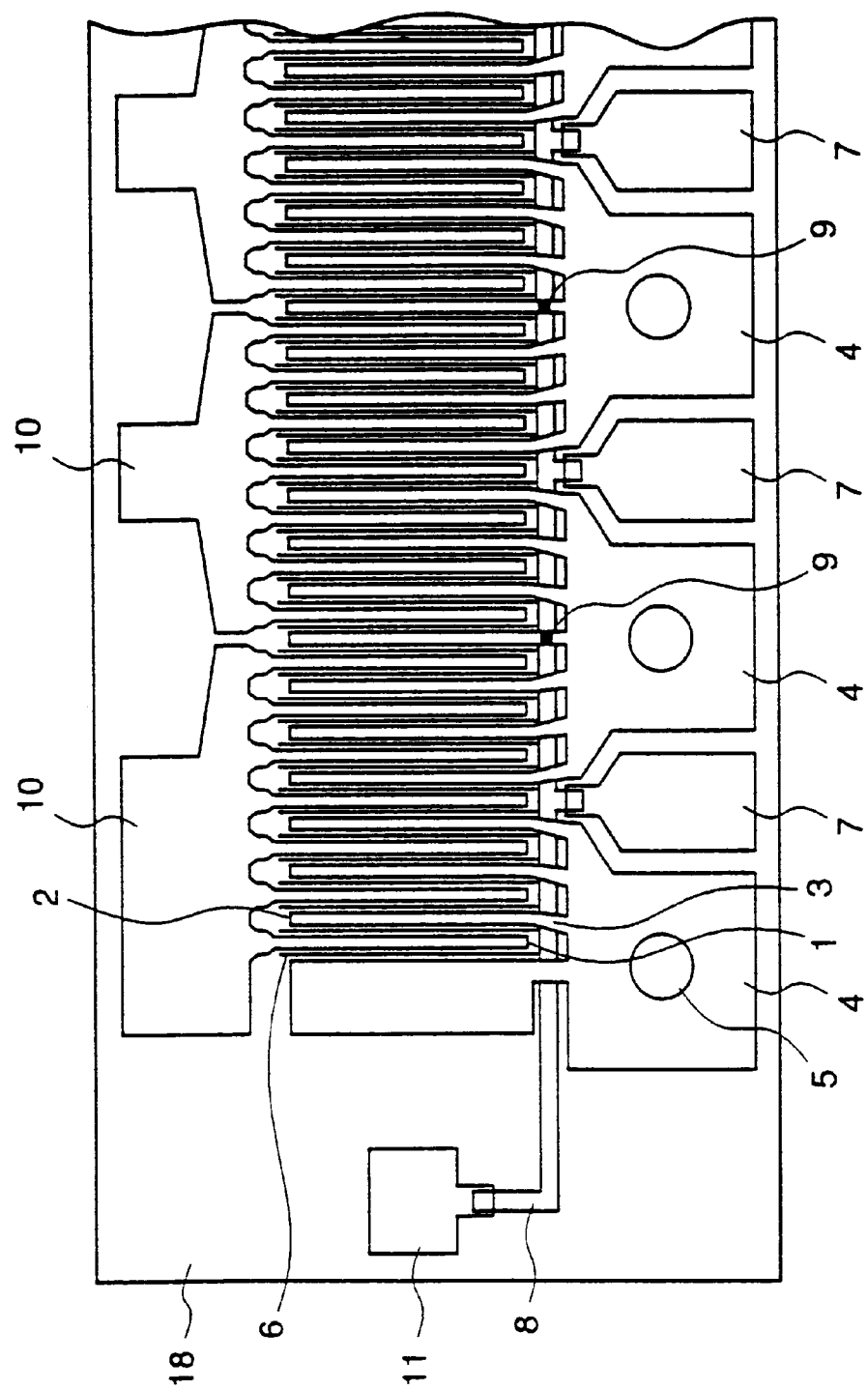
FIG. 1 is a plan view illustrating a semiconductor device according to a first embodiment of the invention.
Figure 2:
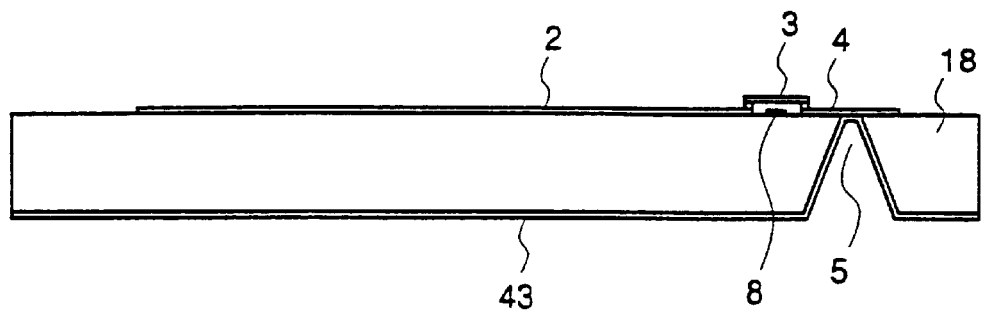
FIG. 2 is a cross-sectional view illustrating a transistor element included in the semiconductor device shown in FIG. 1 along its longitudinal direction.

FIG. 1 is a plan view of a semiconductor device according to a first embodiment of the present invention. FIG. 2 is a cross-sectional view of a transistor element in the longitudinal direction, which is included in the semiconductor device shown in FIG. 1.

The semiconductor device according to this first embodiment is a comb-shaped transistor generally known as a high-power output transistor, in which a plurality of transistor cells, each cell comprising a plurality of transistor elements, are connected in parallel to gain a high-power output. To be specific, the comb-shaped transistor comprises a semi-insulating GaAs substrate 18, a plurality of gate fingers 6, i.e., stripe-shaped gate electrodes, disposed on the substrate 18, a plurality of stripe-shaped drain electrodes 1 connected to drain pads 10, and a plurality of stripe-shaped source electrodes 2 connected to source pads 4. The drain electrodes 1 and the source electrodes 2 are alternatingly arranged facing each other, with the gate fingers 6 intervening, respectively.

The gate fingers 6 are connected to a gate bus 8 which is extended from a gate pad 11 for chip-to-chip connection, and each gate finger 6 is fed through the gate bus 8. In this first embodiment, a transistor cell includes fourteen gate fingers 6, and a gate pad 7 is provided for the fourteen gate fingers 6. Seven drain electrodes are extended from a drain pad 10, and seven source electrodes 2 are extended from a source pad 4. The drain electrodes 1 and the source electrodes 2 are alternatingly arranged facing each other across the gate fingers 6. As shown in FIG. 2, each source electrode 2 is connected through an air bridge 3 to the source pad 4 so that it does not contact the gate bus 8. Further, the source electrode 2 is connected through a via-hole 5 to a rear electrode 43 on the rear surface of the semi-insulating GaAs substrate 1.

The transistor according to this first embodiment is characterized by that portions of the gate bus 8, each portion connecting adjacent two transistor cells, comprise resistors 9. In FIG. 1, the air bridges 3 for connecting the source electrodes in regions where the resistors 9 are present are not shown because the resistors 9 are shown with priority.

Figure 3:
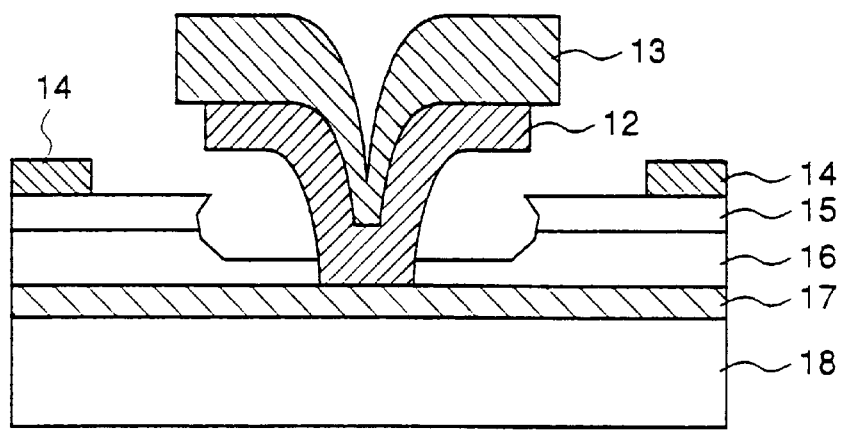
FIG. 3 is a cross-sectional view illustrating a portion of the semiconductor device shown in FIG. 1, including a gate finger or a gate bus.

FIG. 3 is a cross-sectional view of a portion of the transistor, including the gate Finger 6 or the gate bus 8 (hereinafter referred to as a gate structure).

The gate structure of the transistor is constructed as follows. On the semi-insulating GaAs substrate 18, there are successively disposed a channel (active) layer 17, an n⁻ type GaAs layer 16, and an n⁺ type GaAs layer 15. A recess is formed by removing portions of the GaAs layers 15 and 16, and a gate electrode (gate finger 6 or gate bus 8) is disposed in the recess. Ohmic electrodes 14 serving as the drain electrode 1 and the source electrode 2 are disposed on the n⁺ type GaAs layer 15 at opposite sides of the gate electrode. The gate electrode has a double-layer structure comprising a lower gate 12 and an upper gate 13. Preferably, the lower gate 12 comprises Al which has conventionally been used as a gate electrode, or a refractory metal such as WSi or WSiN for high reliability, and the upper gate 13 comprises a low resistance metal such as Au to reduce the gate resistance. When the gate bus 8 is fabricated using such materials as mentioned above, it is possible to make the resistor 9 between the transistor cells using the materials of the gate bus, by arbitrarily determining the width and length of the WSi or WSiN lower gate 12 to obtain a desired resistance, without forming the Au upper gate 13 in the region where the resistor 9 is required. The gate length of the gate electrode is usually 0.1~1 μm. The distance between the ohmic electrodes 14 across the gate electrode is 1.5~5 μm.

Next, a description is given of process steps in a method for fabricating the semiconductor device according to the first embodiment of the invention. FIGS. 4(a)–4(h) are cross-sectional views illustrating process steps of fabricating the gate structure shown in FIG. 3. FIGS. 5(a) and 5(b) are cross-sectional views illustrating process steps of fabricating the resistor 9.

Figure 4:
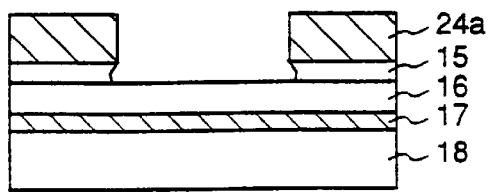
FIGS. 4(a)–4(h) are cross-sectional views illustrating process steps in a method of fabricating the gate finger or the gate bus included in the semiconductor device shown in FIG. 1.
Figure 4:
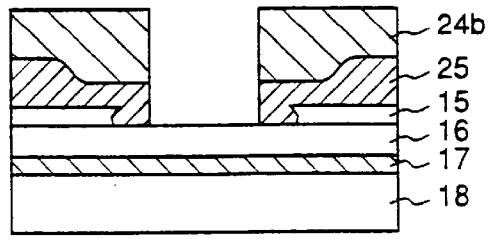
Figure 4:
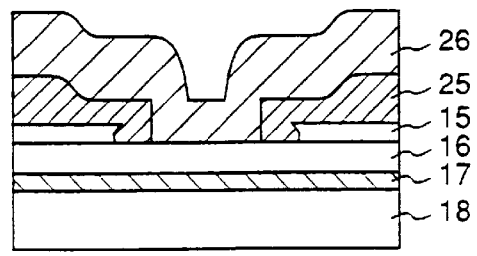
Figure 4:
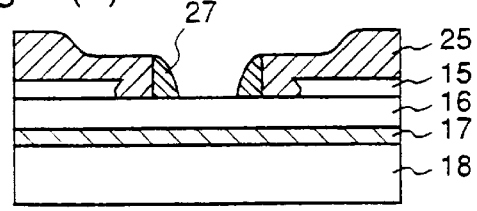
Figure 4:
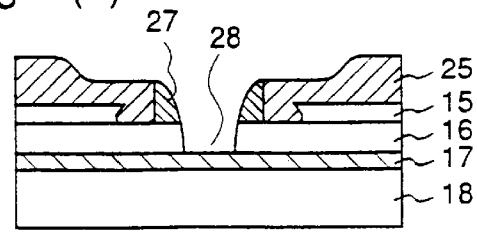
Figure 4:
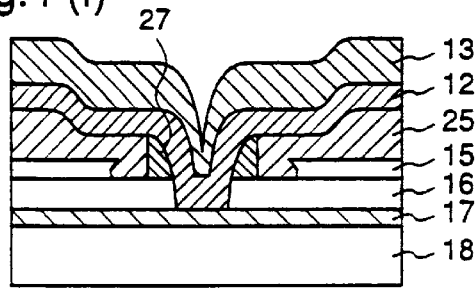
Figure 4:
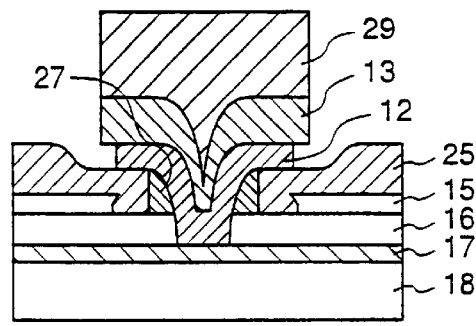
Figure 4:
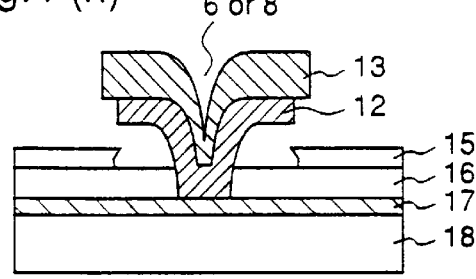
Figure 5:
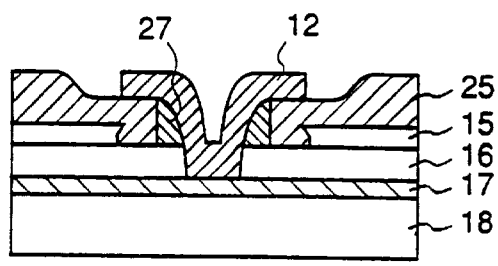
FIGS. 5(a) and 5(b) are cross-sectional views illustrating process steps in a method of fabricating a resistor included in the semiconductor device shown in FIG. 1.
Figure 5:
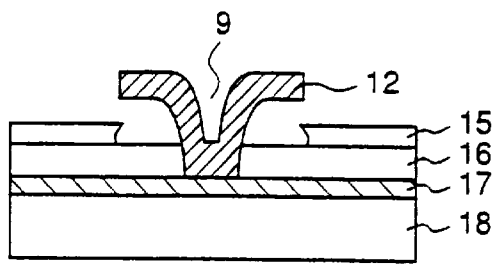

Initially, the channel (active) layer 17, the n⁻ type GaAs layer 16, and the n⁺ type GaAs layer 15 are successively grown on the semi-insulating GaAs substrate 18, preferably by MOCVD (Metal Organic Chemical Vapor Deposition), and a resist film 24a having an opening pattern corresponding to the gate fingers 6 and the gate bus 8 shown in FIG. 1 is formed on the n⁺ type GaAs layer 15, followed by recess etching to form a recess in the n⁺ type GaAs layer 15 (FIG. 4(a)). Thereafter, SiO or the like is deposited on the entire surface by CVD to form an insulating film 25, and the insulating film is etched using a resist pattern 24b as a mask (FIG. 4(b)). Subsequently, on the entire surface, an insulating film 26 such as SiO is deposited by CVD (FIG. 4(c)), and it is etched to form side walls 27 (FIG. 4(d)). Using the side walls 27 as masks, the n- type GaAs is etched to form a recess 28 (FIG. 4(e)). Next, WSi or WSiN is deposited over the surface by sputtering to form a lower gate layer 12, and Au is deposited on the lower gate 12 by sputtering or electroplating to form an upper gate layer 13 (FIG. 4(f)). Next, a pattern of insulating film 29 corresponding to the width of the gate finger 6 or the gate bus 8 shown in FIG. 1 is formed on the upper gate layer 13 and, using the insulating film 29 as a mask, the upper gate layer 13 and the lower gate layer 12 are etched (FIG. 4(g)). Finally, the insulating films 25 and 29 and the side walls 27 are removed to complete the gate finger 6 or the gate bus 8 (FIG. 4 (h)). The gate finger 6 and the gate bus 8 are not necessarily formed in the recess.

When portions of the gate bus 8 are used as the resistors 9 shown in FIG. 1, after the deposition of the Au layer 13 (FIG. 4(f)), portions of the low resistance metal Au in regions where the resistors 9 are to be formed are removed, followed by removal of the insulating film 25 and the side wall 27 (FIG. 5(b)). The size of the WSi or WSiN lower gate layer 12 is determined according to a desired resistance. In this way, the resistors 9 are fabricated. The active (channel) layers 17 in the regions where the resistors 9 are to be formed are insulated in advance by implantation.

Although the gate electrode has a double-layer structure comprising the lower gate 12 and the upper gate 13 in the above-mentioned fabrication method, it may have a single-layer structure comprising the lower gate 12 alone. In this case, the WSi or WSiN lower gate layer 12 is patterned by ion milling or the like to form a desired gate electrode.

After forming the gate fingers 6, the gate bus 8, and the resistors 9 as mentioned above, the drain electrode 1 and the source electrode 2 are fabricated according to their patterns shown in FIG. 1 by depositing a metal such as Al, preferably by sputtering or vapor deposition. The drain pads 10, the source pads 4, the gate pads 7, and the gate pad 11 for chip-to-chip connection may be formed simultaneously with the drain electrode 1, the source electrode 2, and the gate bus 8, respectively. Alternatively, these pads may be formed on the semi-insulating GaAs substrate 18 in advance.

As described above, in the semiconductor device according to the first embodiment, a portion of the gate bus 8 connecting the adjacent transistor cells comprises the resistor 9, and the resistor 9 serves as a gain loss component. Therefore, unwanted oscillation due to unbalance in characteristics between the adjacent cells is canceled, whereby the synthetic efficiency of the transistor is improved.

Figure 12:
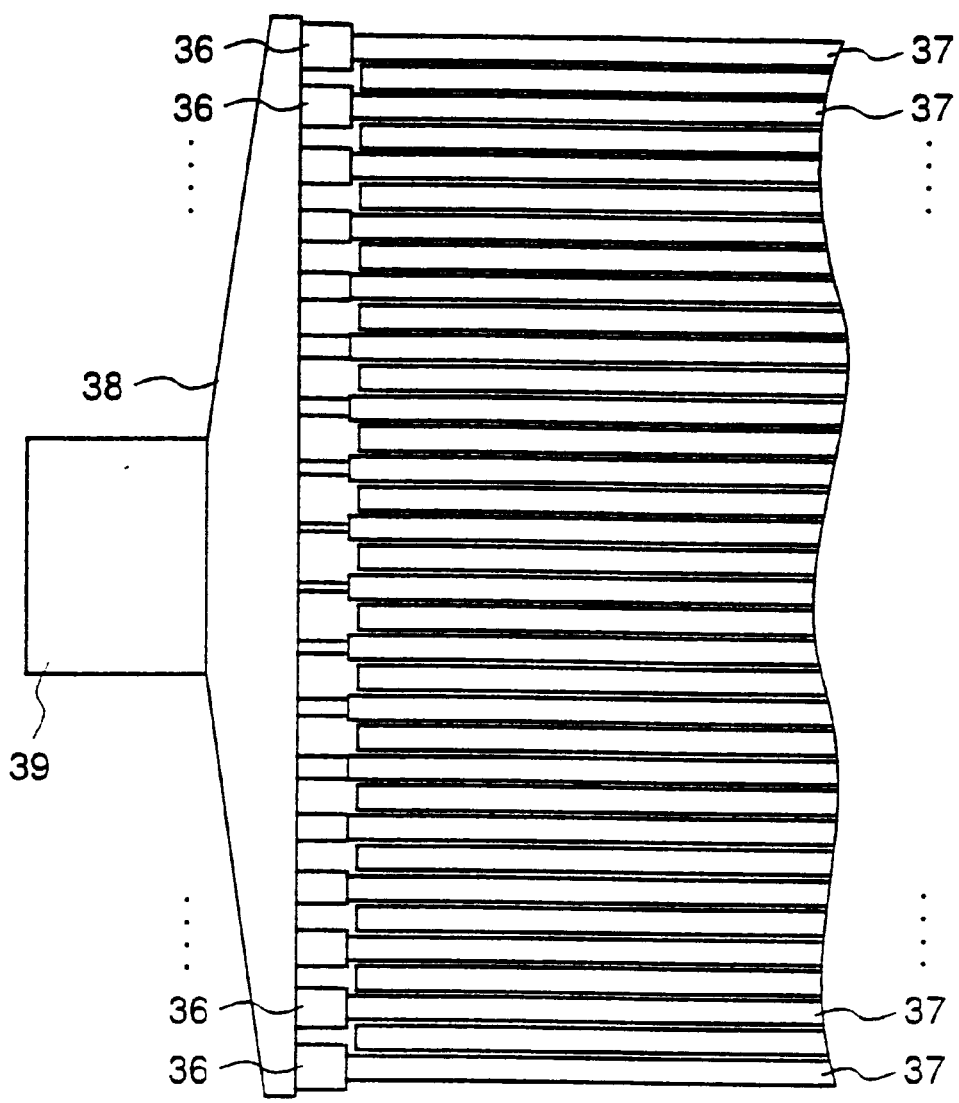
FIG. 12 is a plan view illustrating a semiconductor device according to still another prior art.

Furthermore, since the resistor 9 is disposed between the adjacent transistor cells, the resistor 9 does not serve as a gain loss component unless oscillation occurs due to unbalance in characteristics between these cells. In the conventional transistor shown in FIG. 12, in order to make the operation stable, the resistor 36 is connected to each transistor element although the gain of the transistor element is sacrificed to some degree. In this first embodiment of the invention, however, since there is no possibility that the resistor 9 might increase the gate resistance and the parasitic capacitance, it is possible to make the operation of the transistor stable by canceling oscillation without reducing the gain of the transistor.

Furthermore, according to this first embodiment, there is provided a method of fabricating a semiconductor device including a plurality of transistor cells, each cell having a plurality of stripe-shaped gate electrodes connected to a gate bus, a plurality of drain electrodes, and a plurality of source electrodes, the drain electrodes and the source electrodes being alternatingly arranged facing each other across the gate electrodes, and this method comprises the following process steps: preparing a first conductivity type semiconductor substrate; successively growing an active layer and a second conductivity type semiconductor layer on the semiconductor substrate; successively growing a refractory metal and a low resistance metal on the second conductivity type semiconductor layer; forming a first insulating film on the low resistance metal except portions of the low resistance metal which are to be portions of the gate bus between adjacent transistor cells; etching the low resistance metal using the first insulating film as a mask to expose portions of the refractory metal; after removal of the first insulating film, forming a second insulating film having a pattern corresponding to the gate bus and the gate electrodes, on the refractory metal exposed by the etching of the low resistance metal and on the low resistance metal which has not been etched; etching the low resistance metal and the refractory metal using the second insulating film as a mask, thereby forming a gate bus and gate electrodes having a double-layer structure of the low resistance metal and the refractory metal, and resistors comprising the low resistance metal; and forming drain electrodes and source electrodes on the second conductivity type semiconductor layer so that the drain electrodes and the source electrodes are alternatingly arranged facing each other across the gate electrodes. Namely, after the metals of the gate fingers 6 and the gate bus 8 are deposited, the resistors 9 are formed by selectively removing the low-resistance metal Au (upper gate 13) so that portions of the gate bus 8 between the respective transistor cells form resistors. Therefore, the resistors 9 can be formed with no additional process steps.

Embodiment 2

Figure 6:
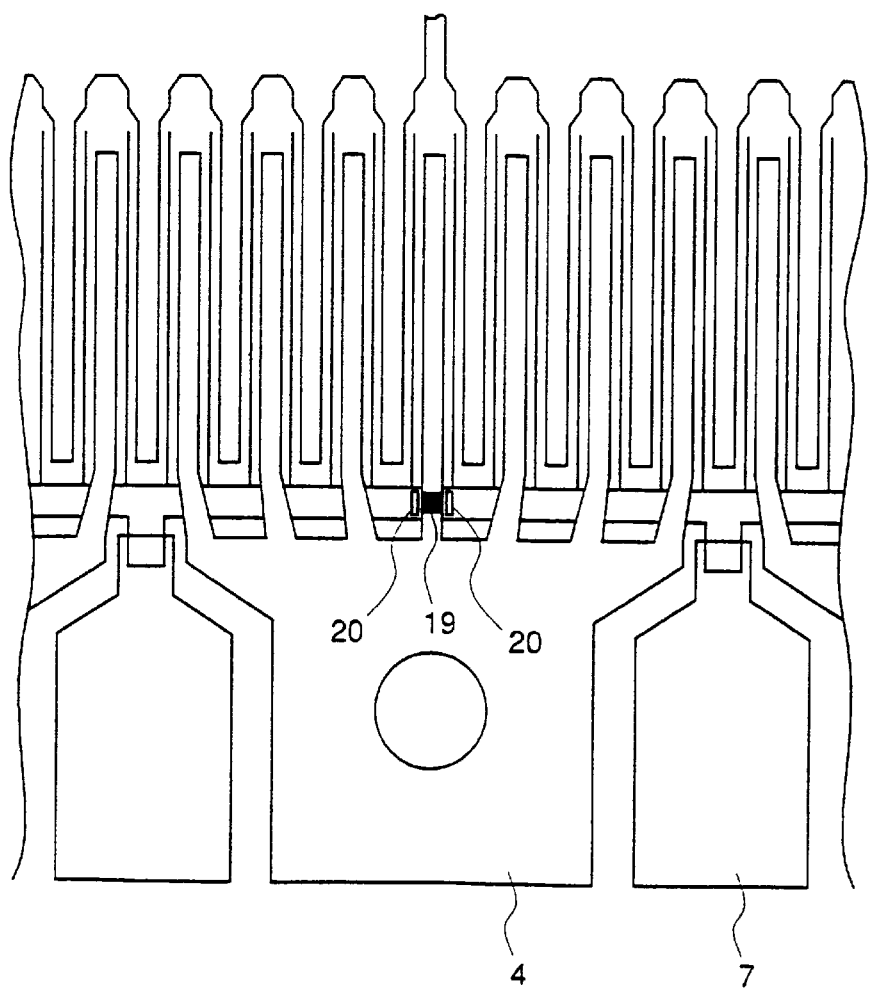
FIG. 6 is a plan view illustrating a semiconductor device according to a second embodiment of the invention.

FIG. 6 is a plan view illustrating a semiconductor device according to a second embodiment of the invention.

While in the first embodiment a resistor 9 comprises a portion of the gate bus 8 between adjacent two transistor cells, in this second embodiment a portion of an active layer 19 disposed on the semi-insulating GaAs substrate 18 is used as a resistor connecting adjacent two cells and the active layer 19 is in ohmic contact (20) with the gate bus 8. In the active layer 19 disposed on the semi-insulating GaAs substrate 18, portions used as the resistors are insulated from portions used as channels of the transistor cells.

As described above, according to the second embodiment of the invention, a resistor between adjacent transistor cells is formed using a portion of the active layer 19 disposed on the semi-insulating GaAs substrate 18. Also in this case, since the resistor serves as a gain loss component, unwanted oscillation due to unbalance in characteristics between the adjacent cells is canceled. As a result, the synthetic efficiency of the transistor is improved.

Embodiment 3

Figure 7:
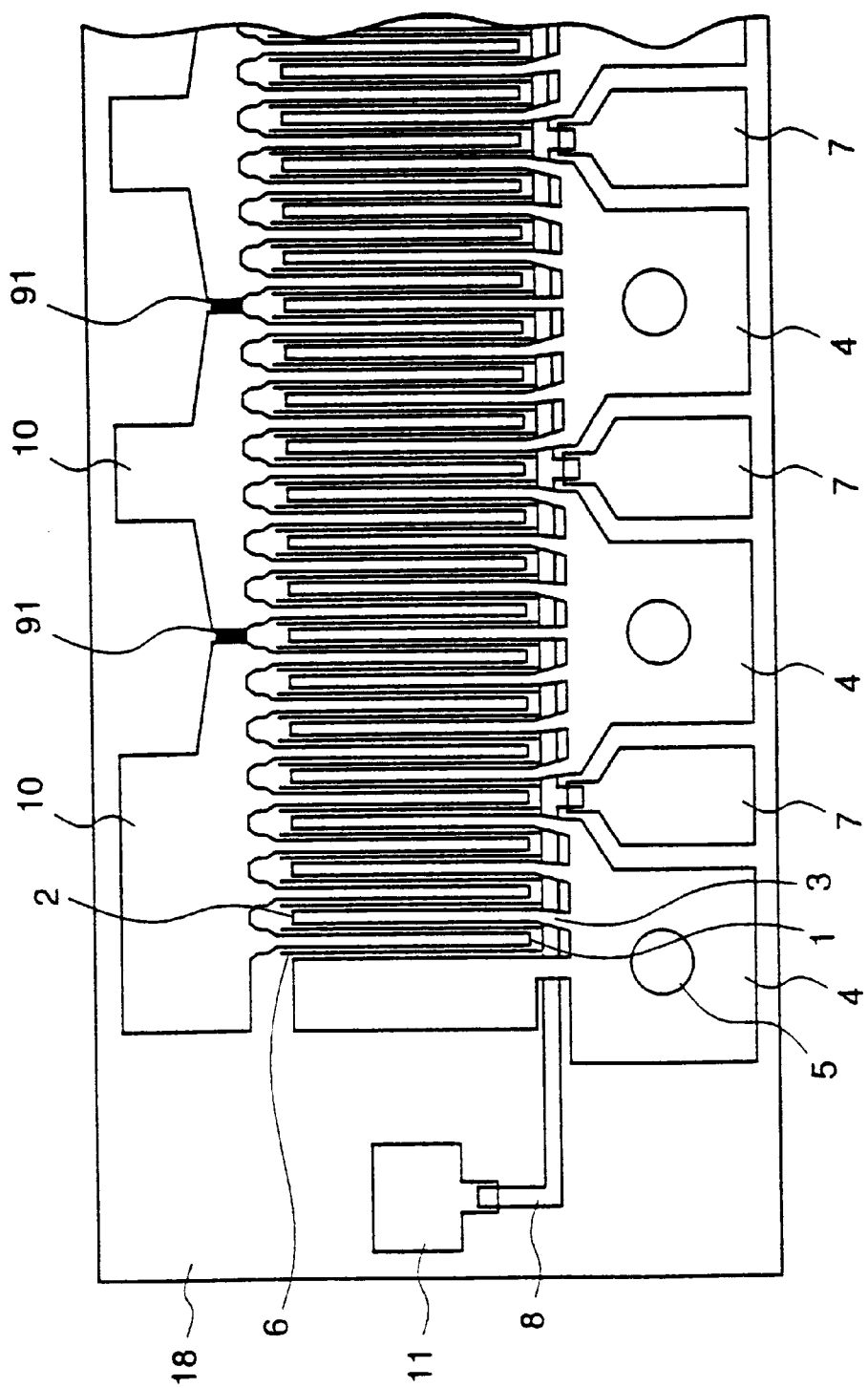
FIG. 7 is a plan view illustrating a semiconductor device according to a third embodiment of the invention.

FIG. 7 is a plan view illustrating a semiconductor device according to a third embodiment of the invention.

In this third embodiment, as shown in FIG. 7, drain pads 10 of adjacent transistor cells are connected with each other through a resistor 91 for preventing oscillation between the transistor cells. This resistor 91 can be fabricated using WSi or WSiN in the same manner as that for the resistor 9 comprising a portion of the gate bus 8 according to the first embodiment. Alternatively, it can be fabricated using a portion of the active layer as described for the second embodiment.

Also in this case, since the resistor 91 connecting the drain pads 10 of the adjacent transistor cells serves as a gain loss component, unwanted oscillation due to unbalance in characteristics between the adjacent cells is canceled, whereby the synthetic efficiency of the transistor is improved.

Embodiment 4

Figure 8:
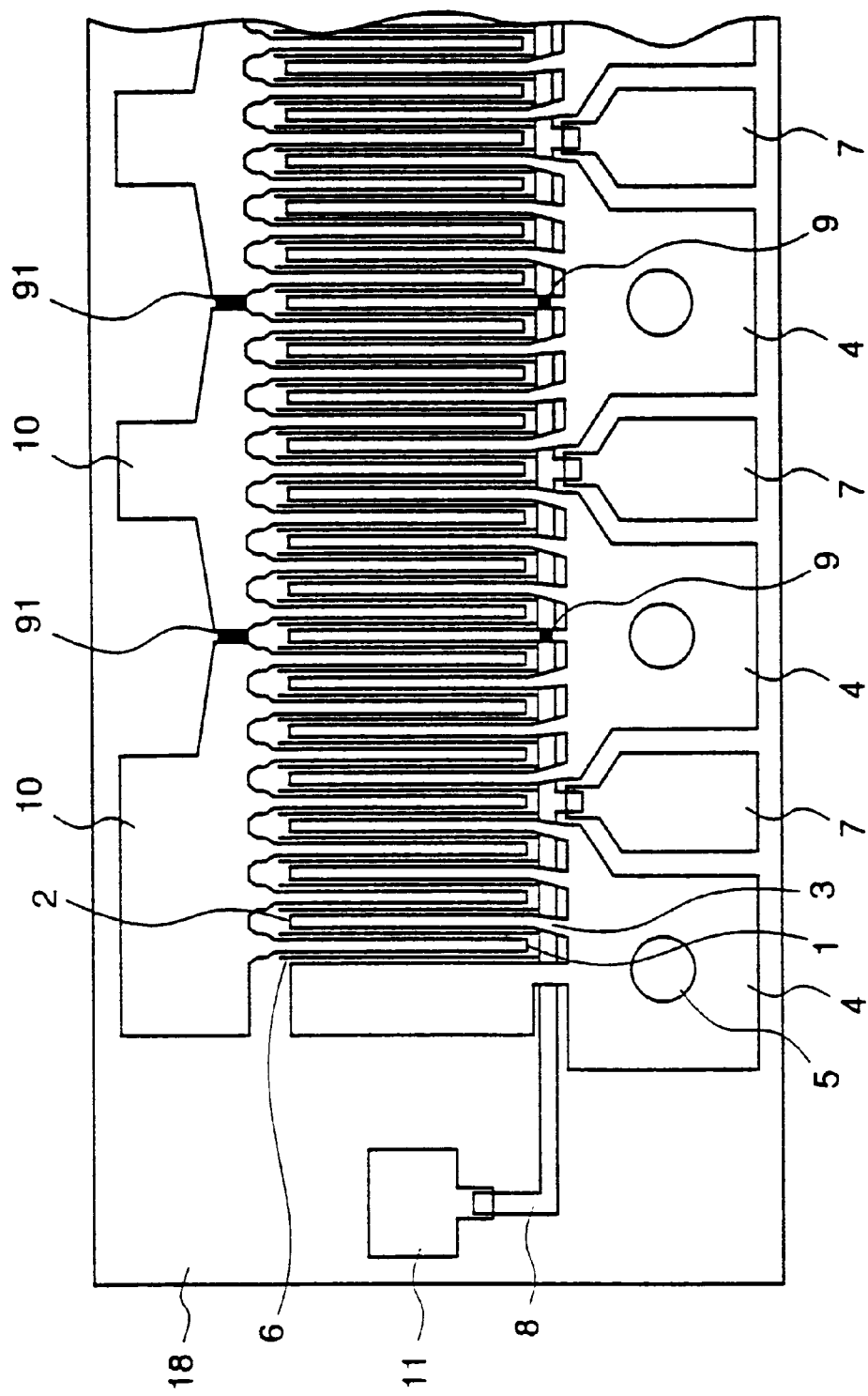
FIG. 8 is a plan view illustrating a semiconductor device according to a fourth embodiment of the invention.

FIG. 8 is a plan view illustrating a semiconductor device according to a fourth embodiment of the invention.

In this fourth embodiment, as shown in FIG. 8, in order to prevent oscillation that occurs between adjacent transistor cells, a resistor 9 is fabricated in a portion of the gate bus 8 between the adjacent transistor cells and, furthermore, the drain pads 10 of the adjacent transistor cells are connected to each other using a resistor 91.

In this case, as compared with the semiconductor devices according to the first to third embodiments wherein the resistors are disposed on either the gate bus side or the drain pad side, oscillation due to unbalance in characteristics between the adjacent cells is canceled in a shorter time.

Embodiment 5

Figure 9:
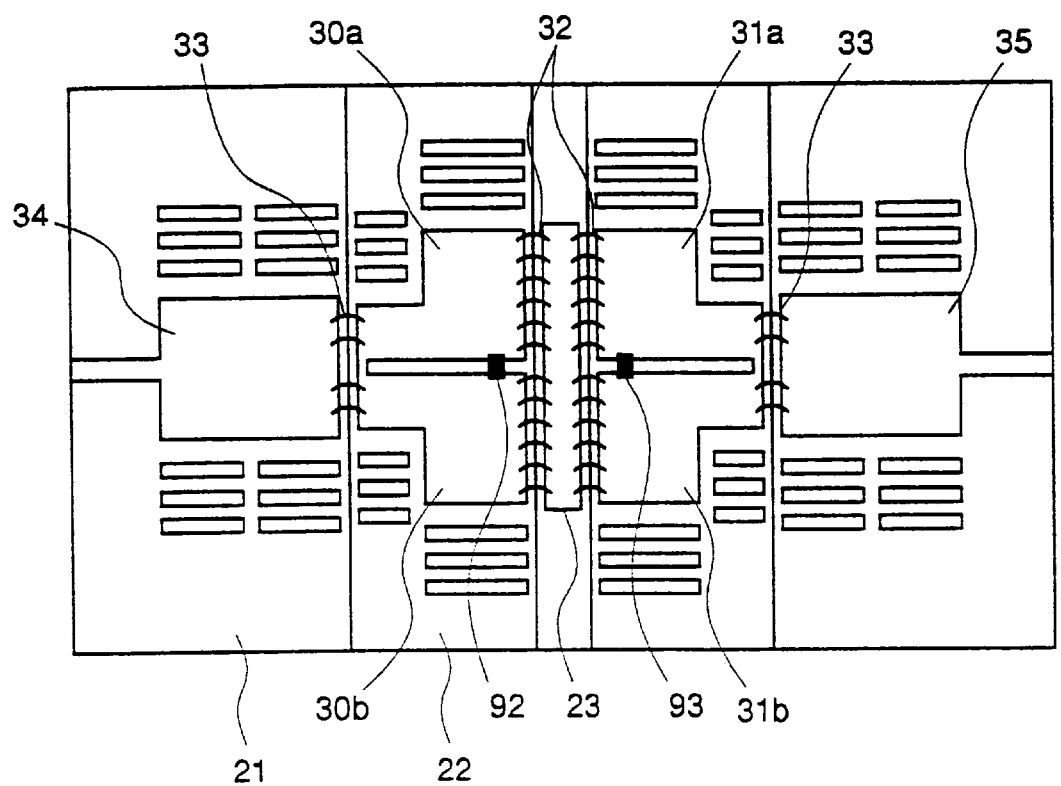
FIG. 9 is a plan view illustrating a semiconductor device used as an IC for power synthesis.
Figure 10:
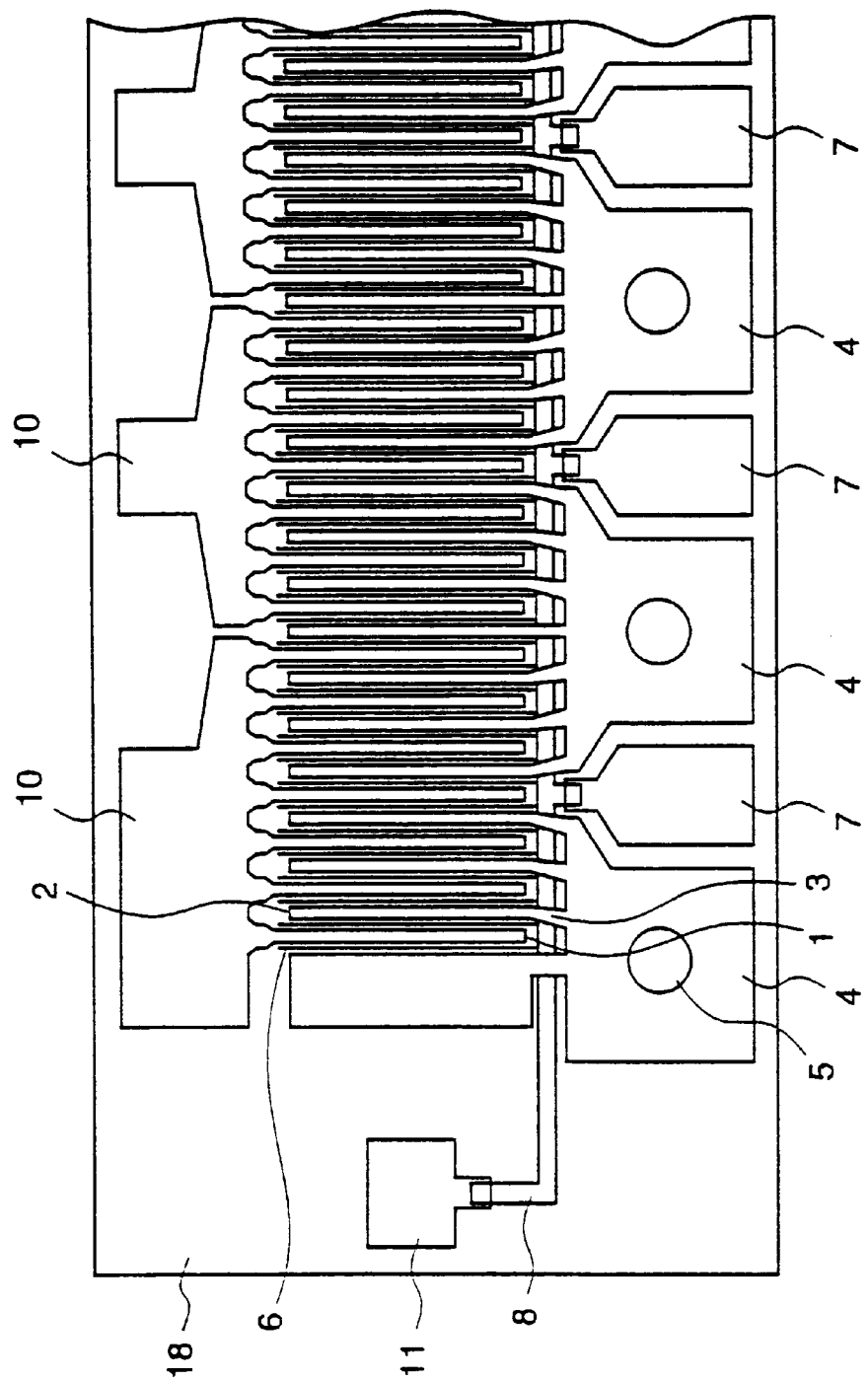
FIG. 10 is a plan view illustrating a semiconductor device according to a prior art.
Figure 11:
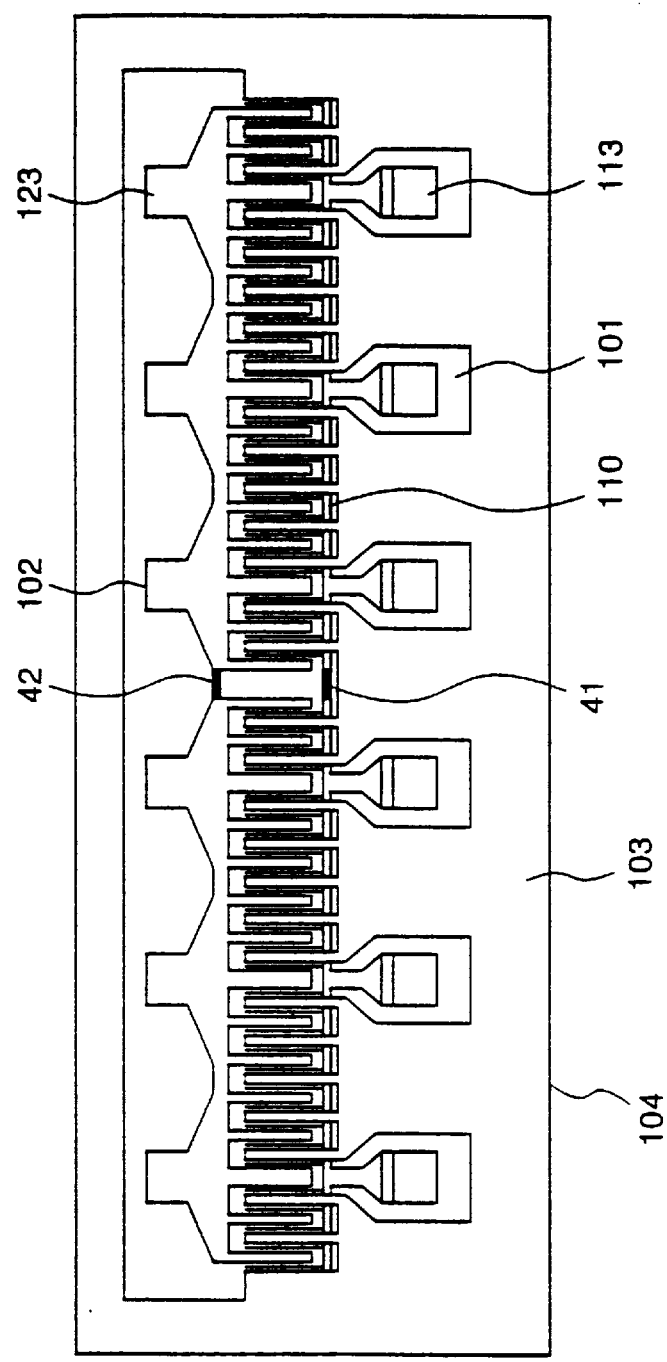
FIG. 11 is a plan view illustrating a semiconductor device according to another prior art.

In a semiconductor device according to a fifth embodiment of the invention, a high-power output transistor chip according to any of the first to fourth embodiments is connected between an input matching circuit 30 and an output matching circuit 31 as shown in FIG. 9. The input matching circuit 30 is divided into two patterns 30a and 30b, and the output matching circuit 31 is divided into two patterns 31a and 31b. The input matching circuit patterns 30a and 30b are connected to each other through a resistor 92 and the output matching circuit patterns 31a and 31b are connected to each other through a resistor 93, whereby unwanted oscillation between the adjacent patterns is avoided. Other constituents are identical to those already described for the conventional device.

Also in this fifth embodiment of the invention, oscillation due to unbalance in characteristics between adjacent transistor cells is canceled. Further, since the resistor 92 (93) is disposed between the plural patterns into which the input matching circuit 30 (output matching circuit 31) is divided, this resistor serves as a gain loss component, whereby relatively low-frequency resonation that occurs between the adjacent patterns is canceled as well.

What is claimed is:

1. A semiconductor device comprising:

a semiconductor substrate;

a high-power output transistor chip disposed on said semiconductor substrate, said transistor chip including a gate bus, a source pad, a drain pad, and a plurality of transistor cells connected in parallel, each transistor cell comprising a plurality of stripe-shaped gate electrodes connected to said gate bus, a plurality of stripe-shaped drain electrodes connected to said drain pad, and a plurality of stripe-shaped source electrodes connected to said source pad, wherein said drain electrodes and said source electrodes are alternatingly arranged, each pair of source and drain electrodes facing each other across one of said gate electrodes; and a first resistor comprising a portion of said gate bus located between adjacent transistor cells for preventing oscillation between said adjacent transistor cells.

2. The semiconductor device of claim 1 wherein said first resistor includes a portion of an active layer of said semiconductor substrate, and said first resistor is in ohmic contact with said gate bus.

3. The semiconductor device of claim 2 further comprising:

a matching circuit for connecting said transistor chip with another transistor chip, said matching circuit being divided into plural patterns; and a second resistor connecting adjacent patterns with each other, for preventing oscillation between said adjacent patterns.

4. The semiconductor device of claim 1 further comprising:
- a matching circuit for connecting said transistor chip with another transistor chip, said matching circuit being divided into plural patterns; and
- a second resistor connecting adjacent patterns with each other, for preventing oscillation between said adjacent patterns.

5. A semiconductor device comprising:
- a semiconductor substrate;
- a high-power output transistor chip disposed on said semiconductor substrate, said transistor chip including a gate bus, a source pad, a drain pad, and a plurality of transistor cells connected in parallel, each transistor cell comprising a plurality of stripe-shaped gate electrodes connected to said gate bus, a plurality of stripe-shaped drain electrodes connected to said drain pad, and a plurality of stripe-shaped source electrodes connected to said source pad, wherein said drain electrodes and said source electrodes are alternatingly arranged, each pair of source and drain electrodes facing each other across one of said gate electrodes; and
- a first resistor connecting said drain pads of adjacent transistor cells for preventing oscillation between said adjacent transistor cells.

6. The semiconductor device of claim 5 further comprising:
- a matching circuit for connecting said transistor chip with another transistor chip, said matching circuit being divided into plural patterns; and
- a second resistor connecting adjacent patterns with each other, for preventing oscillation between said adjacent patterns.

7. A semiconductor device comprising:
- a semiconductor substrate;
- a high-power output transistor chip disposed on said semiconductor substrate, said transistor chip including a gate bus, a source pad, a drain pad, and a plurality of transistor cells connected in parallel, each transistor comprising a plurality of stripe-shaped gate electrodes connected to said gate bus, a plurality of stripe-shaped drain electrodes connected to said drain pad, and a plurality of stripe-shaped source electrodes connected to said source pad, wherein said drain electrodes and said source electrodes are alternatingly arranged, each pair of source and drain electrodes facing each other across one of said gate electrodes;
- a first resistor comprising a portion of said gate bus located between adjacent transistor cells for preventing oscillation between said adjacent transistor cells; and
- a second resistor connecting said drain pads of adjacent transistor cells for preventing oscillation between said adjacent transistor cells.

8. The semiconductor device of claim 7 wherein said first resistor includes a portion of an active layer of said semiconductor substrate, and said first resistor is in ohmic contact with said gate bus.

9. The semiconductor device of claim 7 further comprising:
- a matching circuit for connecting said transistor chip with another transistor chip, said matching circuit being divided into plural patterns; and
- a third resistor connecting adjacent patterns with each other, for preventing oscillation between said adjacent patterns.

10. The semiconductor device of claim 8 further comprising:
- a matching circuit for connecting said transistor chip with another transistor chip, said matching circuit being divided into plural patterns; and
- a third resistor connecting adjacent patterns with each other, for preventing oscillation between said adjacent patterns.

* * * * *